United States Patent
Curcio et al.

(10) Patent No.: US 6,634,543 B2
(45) Date of Patent: Oct. 21, 2003

(54) METHOD OF FORMING METALLIC Z-INTERCONNECTS FOR LAMINATE CHIP PACKAGES AND BOARDS

(75) Inventors: Brian E. Curcio, Binghamton, NY (US); Donald S. Farquhar, Endicott, NY (US); Elizabeth F. Foster, Friendsville, PA (US); Amit K. Sarkhel, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/040,839

(22) Filed: Jan. 7, 2002

(65) Prior Publication Data

US 2003/0127495 A1 Jul. 10, 2003

(51) Int. Cl.[7] .............................. B23K 20/00; B23K 1/11
(52) U.S. Cl. .................. 228/180.21; 228/193; 228/194; 228/215; 361/795
(58) Field of Search ........................ 228/179.1, 180.1, 228/180.21, 180.22, 193, 194, 175, 215; 257/734; 361/795

(56) References Cited

U.S. PATENT DOCUMENTS

| | | | |
|---|---|---|---|
| 3,555,664 A | | 1/1971 | Bingham et al. |
| 4,332,341 A | | 6/1982 | Minetti |
| 4,442,137 A | * | 4/1984 | Kumar ........................ 427/560 |
| 4,640,438 A | * | 2/1987 | Trevison et al. ......... 220/359.5 |
| 5,221,039 A | | 6/1993 | Jung et al. |
| 5,276,955 A | * | 1/1994 | Noddin et al. ................. 29/593 |
| 5,421,507 A | | 6/1995 | Davis et al. |
| 5,686,318 A | * | 11/1997 | Farnworth et al. ............. 438/15 |
| 5,821,627 A | * | 10/1998 | Mori et al. ................... 257/780 |
| 5,873,161 A | * | 2/1999 | Chen et al. ..................... 29/830 |
| 6,294,828 B1 | * | 9/2001 | LaFontaine et al. ........ 257/678 |
| 2002/0038813 A1 | * | 4/2002 | Shinkai |

* cited by examiner

Primary Examiner—Tom Dunn
Assistant Examiner—Kiley Stoner
(74) Attorney, Agent, or Firm—Whitham, Curtis & Christofferson, P.C.; William H. Steinberg

(57) ABSTRACT

Deterioration and damage to insulator materials in an interconnection structure having vertical connections due to exposure to heat during bonding of lamina is avoided by performing diffusion bonding of metal pads at plated through holes (PTH) at temperatures below the melting points of conductive material in the bond. Diffusion bonding is achieved during time periods required for processing (e.g. curing or drying) of insulating materials in the laminated structure.

17 Claims, 2 Drawing Sheets

METHOD OF FORMING METALLIC Z-INTERCONNECTS FOR LAMINATE CHIP PACKAGES AND BOARDS

BACKGROUND OF THE INVENTION

1. Field of the Invention

The present invention generally relates to packaging, carriers and circuit and module boards for electronic devices and, more particularly, to the formation of reliable and robust connections between wiring layers of laminated structures for such components.

2. Description of the Prior Art

Semiconductor devices and integrated circuits, in particular, are in widespread use in electrical and electronic devices of many types. Regardless of application, however, electrical connections must be made to other devices for semiconductor devices and integrated circuits to operate and to perform a useful function. At the same time, the mechanical environment of such electronic components is extremely important to provide mechanical protection and heat dissipation as well as supporting the integrity of electrical connections within and to the exterior of an electronic device package. Such connections have become increasingly complex and of fine connection pitch as integration density of integrated circuits has increased in response to demands for increased functionality and performance as well as potential manufacturing-economy; often requiring more connections to and between chips and forming complex networks.

Such packaging structures are known and have been developed to function at numerous levels extending from inter-chip connections (e.g. where chips are stacked or otherwise placed in close physical proximity and interconnected), to lead frames and the like for individual or multiple chip packages, to modules which can interconnect many chips with very short interconnects-and to boards which may function to carry many modules or discrete devices. Increased integration density and increased complexity of various electronic apparatus have led to extreme complexity of the connections made by the packaging structures. At the present time, a large number if not the vast majority of interconnection and packaging structures have plural layers of patterned conductors in order to provide the required interconnectivity at different levels within particular electronic apparatus.

The increasing variety of applications of electronic apparatus is accompanied by an increased range of environmental conditions of temperature, humidity, mechanical stress and the like while the increased performance of individual components generally leads to similarly wide variations in more or less localized regions within the apparatus; both of which cause increased electrical, thermal and mechanical stress at each level of interconnect and packaging structures. At the same time, the increased complexity and closeness of manufacturing tolerances of interconnect and packaging structures tends to increase susceptibility to damage or sensitivity to such stresses that may degrade performance or reliability.

Of particular concern, with the increased utilization of layered interconnect structures is vertical interconnects which extend through and between layers of insulator which carry connection patterns. These connections generally take the form of drilled and plated through holes (sometimes referred to as vias when formed by filling of a hole in a core, possibly by deposition processes other than plating) that intersect the desired layers for electrical interconnection. Substantial difficulties of fabrication are presented by increasing requirements of registration accuracy as conductors are formed at finer pitches on the surfaces of individual substrates. As a consequence, the plated through holes must become even smaller and more accurately located. Further, integrity of the mechanical joining of boards must be assured in order to avoid concentration of forces in the vertical electrical connections. Conversely, the formation of vertical connections must not compromise the mechanical joining of lamina or the dielectric properties of the lamina or insulating material interposed between them or require excessively costly processes.

For example, substantially the only practical technique for forming an integral vertical connection through a plurality of lamina is drilling through holes in an insulator, often referred to as a dielectric, with high location accuracy and plating the interiors thereof using a plurality of plating and/or filling processes to obtain adequate conductor cross-sectional area, resulting in a so-called plated through hole (PTH) structure. (The term plated through hole or the acronym PTH will be used hereinafter to collectively refer to both plated through holes and vias; to which the invention is also fully applicable.) For long vertical connections, such a process is, however, much more expensive, difficult and generally of lower yield than bonding between conductors formed on individual lamina, even though the latter type of construction does not form a similarly integral (e.g. one-piece) structure. In general, through holes having an aspect ratio of more than about 10:1 (or lower as the diameter decreases) cannot be reliably plated or filled to form a connection.

Therefore, formation with a plurality of thinner lamina having aligned plated through holes is virtually the only available technique for forming small vertical connections through a thick insulator of an interconnection structure. However, the bonding process must be accomplished within a relatively small heat budget to avoid compromise of the insulator. Thicker insulators and longer vertical connections generally require increased heat exposure of the insulator either to achieve sufficient temperatures for bonding (by solder reflow) at the interior of a thick stack of lamina or to perform bonding of thinner stacks of lamina in separate operations.

More specifically, the bonding of connections formed on individual lamina presents several problems in that the bond must be reliably formed in a near-ideal configuration to be robust, high temperature involved in the bonding process is likely to degrade or possibly even destroy dielectric properties of insulators and known bonding processes involve mechanisms that are likely to complicate or compromise accurate registration between lamina and points where vertical connections are to be formed.

For example, solder bonding between connections involves the difficulty of controlling the location of molten solder which may bond less than the intended surface area of a contact ad reducing strength and increasing electrical resistance, while solder flowing out of the intended connection may cause shorting between conductors. Temperatures at which most solder alloys (e.g. except for eutectic and near-eutectic low melting point solders) will flow or reflow are also well above the temperature at which epoxy and other board insulator materials will begin to decompose. While dielectrics can tolerate transient solder reflow temperature excursions, extended high temperature dwells are generally required for reflow to form a plurality of internal connections in a multi-layer laminate structure since the heat for melting the solder material must be supplied in addition to the heat required for the structure to reach the temperature of the melting point of the solder. Low temperature solders present additional process difficulties since they melt during any other solder bonding process and other solder processes cannot be performed selectively thereto.

Also, the more or less viscous molten solder collapses to some degree in the vertical direction and may allow lateral shifting of lamina away from a properly registered position. This latter problem is also true of conductive adhesives which may be used at lower temperatures but which do not generally develop optimal mechanical strength unless a heat treatment (e.g. curing or sintering) is also applied that poses additional problems similar to solder.

That is, some finite amount of deterioration of insulators will occur at temperatures well below the melting point of solder or the curing or drying processes required for conductive adhesives; both of which also involve properties which may compromise registration of lamina and/or movement of materials in an uncontrolled manner that can decrease manufacturing yield. In regard to insulator deterioration, short exposure to high temperature does not cause significant damage but the amount of damage caused is cumulative if additional heat exposure is required for other processes, especially field repairs where temperature cannot be well controlled.

Even more sophisticated and recently developed metallurgical techniques have not solved these problems. For example, so-called transient liquid phase (TLP) techniques use differing mutually soluble metals so that as the temperature approaches the melting point of either, alloying takes place forming a eutectic alloy of reduced melting point. As more of the lower melting point metal goes into solution, the melting point of the alloy rises and solidifies as a transiently liquid interface progresses through the bond.

The benefits of TLP processes thus derives from the fact that the temperature can be minimized and that the resulting bond will have a higher melting point than the temperature used to form the bond while some reduction in dimensional change is derived from the fact that the molten interface is limited to a relatively small thickness. This may be an important point of concern if subsequent process requires high temperature concerns for assembly or may be exploited since the bond can be returned to the bonding temperature or somewhat higher temperature without affecting the TLP bond. However, even this small thickness may be sufficient to allow compromise of registration by shifting of lamina and the temperatures required for TLP are well above temperatures that can cause damage in most dielectrics and, in any case, the material set for dielectrics and metals for TLP processes (which also require extended time for the transiently liquid interface to progress through the bond) necessarily imposes a very narrow process window as well as limiting the materials which can be employed.

SUMMARY OF THE INVENTION

It is therefore an object of the present invention to provide a technique of forming robust bonds for vertical connections between and through lamina which do not require drilling and through hole plating of lamina stacks and which can be carried out without compromise of registration of lamina or thermal damage to dielectric materials.

It is another object of the invention to provide a technique of forming a robust bonded vertical interconnection structure using a low temperature process well below the melting point of metals in the bond.

It is a further object of the invention to provide a multi-level connection structure that can be manufactured at reduced cost and increased yield and which has improved dielectric properties substantially equivalent to constituent dielectric materials and improved structural integrity and robustness In order to accomplish these and other objects of the invention, a multi-layer connection structure having vertical connections between respective lamina is provided comprising patterned conductive features on facing surfaces of respective lamina, and a region at an interface of the patterned conductive feature in which material of the patterned conductive features and a joining material are interdiffused without solution of either in the other to form a diffusion bond.

In accordance with another aspect of the invention, a process for joining substrates is provided comprising the steps of providing a first substrate having first circuitized features of electrically conductive material on an external surface thereof; providing a second substrate of an electrically conductive material on an external surface thereof wherein at least-some areas of the conductive material are located in a mirror image pattern to the first circuitized features; depositing a joining material on at least a portion of at least one of the first and second circuitized features; thereafter positioning the second substrate adjacent the first substrate with at least some of the second circuitized features or the joining material thereon in contact with the first circuitized features or the joining material thereon; and applying pressure and heat to the first and second substrates to laminate the substrates and provide a diffusion bond between the first and second circuitized features, the heat producing a temperature below a melting point of the joining material or the circuitized features.

In accordance with a further aspect of the invention, a method of forming a multi-layer connection structure having vertical connections between conductive areas on surfaces of respective lamina is provided comprising steps of applying joining material to portions of the conductive areas of at least one lamina, positioning at least two lamina with at least some of the conductive areas in registration with some of the conductive areas on another lamina, and diffusing at least one of the joining material and material of the conductive areas into the other at a temperature below the melting point of either the joining material or the material of the patterned conductive features.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
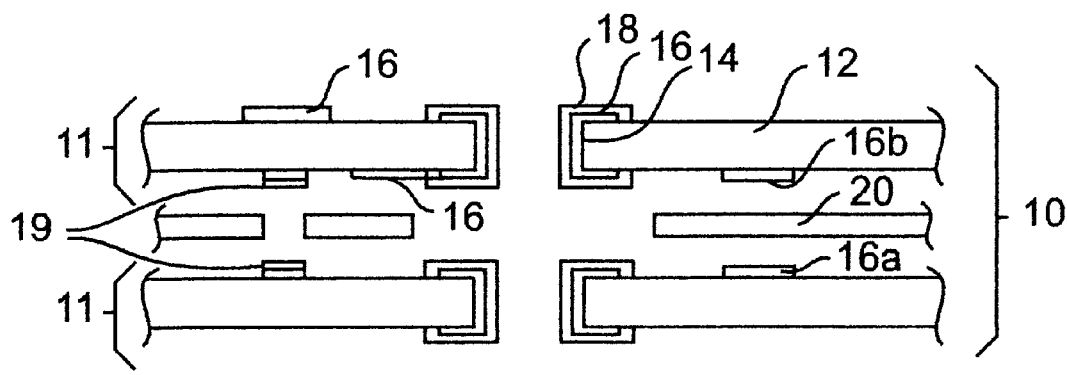
FIG. 1 is an exploded cross-sectional view of a portion of a multi-layer connection structure in accordance with the invention.

Referring now to the drawings, and more particularly to FIG. 1, there is shown an exploded cross-sectional view of portions of two representative lamina of a multi-layer connection structure in accordance with the invention. It should be understood that the connection structure in accordance with the invention can be fabricated by the same basic process for use at any level of electronic circuit packaging such as lead frames, modular structures, circuit boards or the like alluded to above. It should also be understood that the invention can be practiced with success to achieve the meritorious effects of the invention with numerous systems- of metals and other materials, allowing substantial design latitude for various applications. The form of the metals and materials which may be used in accordance with the invention may also be varied, as will be described below to allow numerous processes to be employed in accordance with the basic principles of the invention.

Figure 2A:
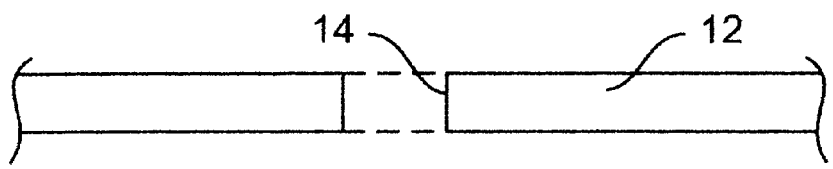
FIGS. 2A, 2B, 2C and 2D illustrate a generalized process of manufacture of a multi-layer connection structure in accordance with the invention.
Figure 2B:
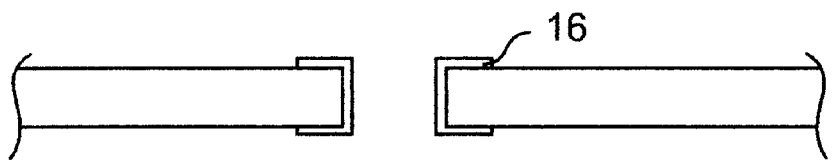

The connection structure 10 in accordance with the invention includes two insulating substrates 12 which may be of, for example, epoxy with embedded glass fiber, polymer, ceramic or other materials such as recently developed fluorocarbon-based materials (e.g. polytetrafluoroethylene (PTFE)). Through holes 14 are formed (e.g. by drilling, etching, stamping, photo exposure and development, electric discharge machining, laser ablation and the like) therein as shown in FIG. 2A and conductive patterns 16 including circuitized features (e.g. 16a, 16b, 19) produced on one or both major surfaces and extending within through holes 14 as shown in FIG. 2B. This results in the standard lamina structure as currently known and used in the art and conventional lamina structures may be employed in the practice of the invention so long as the surfaces to be bonded are sufficiently coplanar or can be raised to suitable and complementary heights to be in contact during lamination.

Figure 2C:
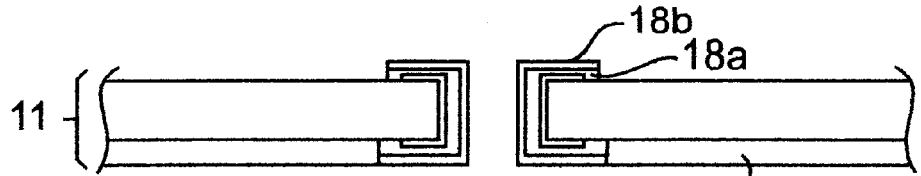

In accordance with the invention, a layer of joining material 18 such as a metal is formed over the conductive patterns 16 at least through holes 14, as shown in FIG. 2C and other locations such as is illustrated at 19 where bonding of connections between lamina is desired. The joining material layer 18 may also extend into the through hole 14 as well as on the surface of the flanges or pads formed by the conductive pattern (or ends of the conductive material in the through hole if no connection is made at a given surface although formation of a small flange or pad is preferred) as a matter of process convenience but has little function other than as conductive fill at that location. The joining material may be applied by any suitable process such as plating by any known process (e.g. electroless, electrolytic, immersion/ replacement and the like), vacuum deposition, sputtering, screening of a conductive paste or other techniques that will be apparent to those skilled in the art.

The above structure creates raised regions in the form of flanges or connection pads at the through holes or other desired locations. A through hole is not required but will generally be used since vertical connections will usually extend through several substrates and connect patterned connections 16 on both sides of some but not necessarily all substrates 12. The individual lamina comprising substrate 12, patterned conductors and joining material 18 will be collectively referenced by reference numeral 11.

Figure 2D:
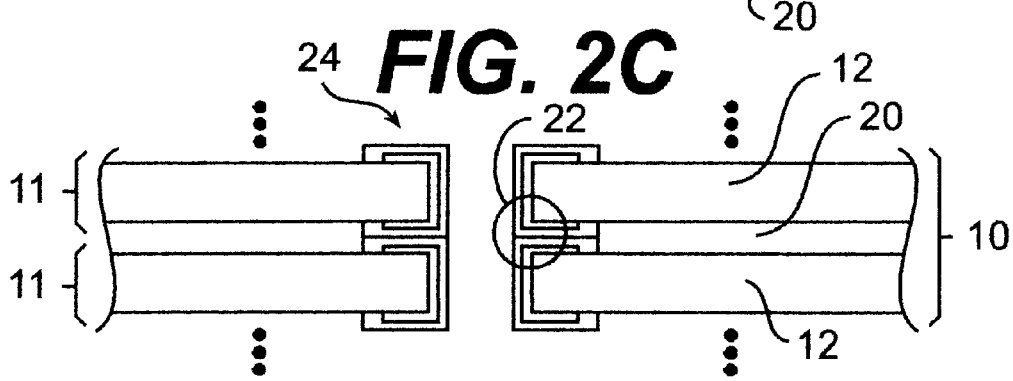

The multi-layer structure 10 is completed by lamination of two or more lamina 11 using an insulating layer or sheet 20 to provide adhesion between substrates 12 and insulation (as well as encapsulation and adhesion) of respective conductive patterns 16 (e.g. 16a and 16b) which are not to be bonded, as shown in FIG. 2D. This lamination is performed in accordance with the invention at a relatively low temperature well below the melting point of metals or curing/ drying temperatures of other materials and some compressive force which is sufficient, depending on particular material combinations, to form an insulating mechanical bond between substrates 12 and conductors 16 (16a, 16b) thereon and a conductive diffusion bond where joining material 18 is present (and which is thus slightly raised above the surface of conductive patterns 16).

A diffusion bond can be readily distinguished from a bond where melting has taken place by the distribution of materials near the interface where bonding has occurred. Where melting has occurred, the individual grains in the bond material will be substantially homogenous with one or more materials dissolved in another whereas in a diffusion bond a gradient of material concentration will be evident within the largely intact crystallographic structure of the bonded materials. This difference will be evident in numerous material properties that can be observed by scanning electron microscope observation, X-ray diffraction, anisotropic etching and other techniques used in determination of maerial properties and familiar to those skilled in the art.

In this regard, it is important to an understanding of the invention to note that at least some of the flanges (or ends) of the plated through holes (PTH) 16, 18 and other bonding pads 19 are located in mirror-image patterns on surfaces which will be adjacent in the finished structure and thus bear against each other in the stack 10 of lamina 11 and the frictional engagement thereof is sufficient to maintain registration of the lamina. Therefore, essentially no shear force is carried by the insulator 20 or surfaces of substrates 12, especially where pin fixtures are employed to maintain alignment, as is the general practice. This effect would also be achieved by a variant form of the invention in which the substrate may simply be a conductive (e.g. copper or other metal) sheet to be bonded to patterned features on another substrate with the later formation of individual features by patterning the conductive sheet.

It should also be noted that it is not necessary for the aligned PTHs to extend entirely through the laminated structure 10 but it is preferable, during fabrication, that as large a number of aligned PTHs as possible do so, even if such a design results in a substantial number of dummy or unused contacts at the upper and/or lower surfaces of the laminated structure since the formation of the diffusion bond requires pressure to be applied and such pressure can be applied more reliably and accurately by direct application to a continuous PTH stack. Ideally, the design should avoid dummy contacts since they would consume area that would otherwise be available for connections. In this regard, it should be appreciated that the invention allows addition of lamina at will in separate operations to allow optimal or near optimal assembly/lamination conditions to be achieved for any structure while minimizing or avoiding dummy contacts consistent with acceptable throughput.

However, the pressure is not particularly critical and diffusion bonds can be reliably formed if compressional force is kept close to but below the yield point of the metal in the number of continuous stacks which are presented, considering the total cross-section of the metal therein and the number of lamina. Substantial pressure sufficient for reliable diffusion bond formation can be carried by the insulator material 12, 20, even in a viscous, semi-liquid state while the overall geometry of the laminated structure 10 is maintained by the continuous PTH stacks 24 during application of pressure and heat. Alternatively, fractional height vertical connections could be formed in a plurality of lamina less than the total number (through which the stacked PTHs would fully extend) and additional lamina added on the top and/or bottom thereafter.

While the invention may be practiced over a wide range of temperatures and pressures, which can also be reduced substantially at the cost of longer application time and somewhat reduced throughput the particular temperature, pressure and time chosen may be somewhat critical, depending on the materials of the board, chip carrier, etc. design and, while complete avoidance of dielectric damage is a meritorious effect achievable by the invention, some degree of damage may be tolerable in some circumstances (e.g. to support high production volume). For example, it is known that resins used in multi-functional, high glass transition temperature (Tg) epoxy based structures begin to melt at about 70° C. but temperatures of about 185° C. are necessary to cure such resins while onset of decomposition has been observed at about 250° C. to 300° C. For recently developed fluorocarbon based dielectrics, alluded to above, the onset of melting occurs at about 325° C. while onset of decomposition occurs progressively at temperatures above 400° C. Onset of decomposition of some so-called low-k dielectrics recently developed has been observed at 200° C. or somewhat lower.

It should be noted that all of the above-noted temperatures are below the melting point of many non-eutectic tin-lead solder alloys and melting points of other metals or alloys may be substantially higher (e.g. 962° C. for silver, 1064° C. for gold and 1455° C. for nickel) as may be confirmed from standard reference sources. In other words, if a eutectic or other solder alloy having a melting point below that which will damage the laminate, the vertical interconnect structure will be melted during assembly and if such melting is to be avoided with a higher temperature melting point solder, damage to the dielectric is unavoidable.

Therefore, it can be appreciated that some melting and/or decomposition of insulator/dielectric materials is virtually inevitable with any known bonding process which relies on metal reflow while such metal reflow also compromises maintenance of registration of the lamina stack during bonding, as discussed above. It is also generally the case that the materials at which reflow can be achieved at lower temperatures are also softer and less mechanically robust as well as having higher electrical resistance. Therefore, dielectric material properties have placed substantial constraints on conductor materials and their mechanical and electrical properties and vice-versa.

In general, the temperature range preferred for practice of the invention should be limited to temperatures below the decomposition temperature of the dielectric used but a minimum temperature may be required if curing of a material is to be achieved within reasonable process time limits. Therefore, process temperature is usually determined based on insulator properties and time required for acceptable throughput in consideration of insulator properties and pressure is preferably determined empirically to achieve the desired degree of diffusion in the same time period but within the limitation of the yield point of the materials. Suitable ranges for temperature, pressure and time for various material sets can be extrapolated or estimated from the examples which will be discussed in detail below.

As alluded to above, numerous metal systems and dielectric and substrate materials may be used in the practice of the invention. The form of these materials and the techniques of their application may be of more importance to the design of the structure than the electrical and/or mechanical properties thereof in the completed structure in regard to the fabrication economy thereof since a reliable and robust bond will be formed in accordance with the invention as long as sufficient heat and pressure are applied for a sufficient time for diffusion bonding to occur, as can be readily established empirically without undue experimentation.

For example, dielectric 20 can be applied as a conventional perforated sticker prepreg (usually a fibrous or porous matrix substantially saturated with an adhesive/resin) but could be applied by screening of a paste or as a photo-imageable dielectric in any form. These materials are well-known in the art and commercially available. Other appropriate materials and application techniques and material forms will be apparent to those skilled in the art. Similarly, joining material 18 can be applied by any form of plating such as electroless, electrolytic or immersion/replacement plating processes or as a screened conductive paste/adhesive as is well-known in the art and commercially available. (However, in the latter case, it is to be understood that the supporting matrix or screenable material serves only as a carrier for the conductive joining material and is not relied upon in any way for formation of the diffusion bond in accordance with the invention. In fact, it is preferable that sufficient pressure be applied to force the carrier/supporting matrix material out of the bonding region and compact the conductive joining material.)

While not preferred because of somewhat increased complexity and narrowed process windows, it is possible to apply both dielectric 20 and joining material 18 by screening. Such a technique would entail screening of the dielectric or conductive paste and partial curing or drying thereof followed by application of the other, possibly followed by a similar partial cure or drying. The lamina can then be assembled and full curing carried out. However, in this case, the partial cure of either the conductive or insulator paste should be sufficient that sufficient shear forces could be carried to avoid compromise of registration.

Three illustrative examples of implementation of the invention will now be discussed in connection with FIGS. 3–5, respectively. These examples have been chosen to reflect the variety of materials and processes by which the invention may be successfully practiced and should not be considered as in any way exhaustive or limiting. In general, materials can be freely chosen in accordance with their electrical and mechanical properties with materials of lesser density being somewhat preferred for the patterned conductive features and materials of lower atomic weight being somewhat more preferred for joining materials since these qualities, among others, tend to favor more rapid interdiffusion at a given temperature and pressure. Copper will be assumed for the PTH structure 16 in FIGS. 3 and 4 since it is generally considered to be preferred but other materials (e.g. metals or alloys) could be substituted, as may be desired, such as nickel or a nickel or alloy layer over copper or alloy. The region shown in each of these Figures generally corresponds to the circled region of FIG. 2D including a corner of a PTH.

EXAMPLE 1

Figure 3:
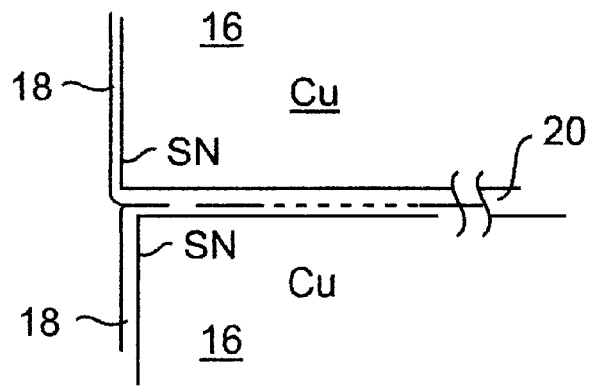
FIGS. 3, 4 and 5 show scanning electron microscope photomicrographs of bonded portions of cross-sections of multi-layer connection structures in accordance with the invention at different magnifications of about 500×, 1000× and 7000×, respectively, and employing different exemplary metal systems.

Referring now to FIG. 3, perhaps the simplest technique of practicing the invention is illustrated. If copper is used for PTH 16, a very thin layer of tin is preferably plated thereon by immersion in which some copper molecules are replaced by tin molecules when the lamina 11 is immersed in a tin-containing solution. The joining layer is thus referred to as immersion-tin (I—Sn). Two similar lamina (although it is only important to have a joining material on one lamina, but I—Sn on both is preferred since the tin layer 18 is very thin) are then placed together in registration with a drilled sticker prepreg such as IBM DRICLAD Hi-Tg multi-functional epoxy dielectric with Tg=182° C. In the lamination process, a pressure of about 500 psi is applied at a temperature of about 200° C. for about ninety minutes to form a diffusion bond and cure the resin in the prepreg 20. The tin layers diffuse into each other and into the copper of the PTH to form a robust bond. Since the process is carried out below the melting point of either tin or copper and interdiffusion but not solution occurs, there is no copper precipitation and certainly no observable grain dislocation upon cooling. It should be noted that, as an alternative to predrilled sticker sheets a photoimageable dielectric layer such as DYNAVIA 2000, available from Shipley-Ronal, Marlboro, Mass., may be used on one or both lamina.

EXAMPLE 2

Figure 4:
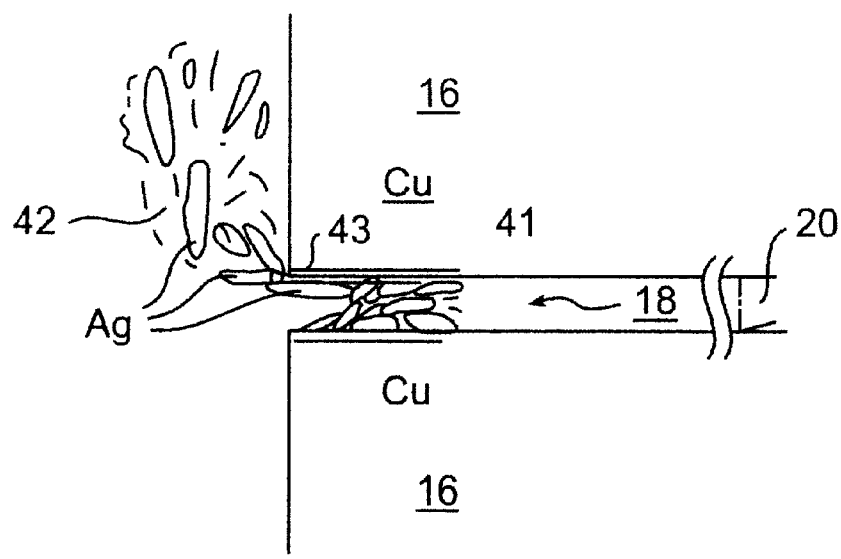

In FIG. 4 a perforated prepreg 20 is positioned between both lamina and a viscous conductive material 18 (here, silver particles in an organic binder such as ABLESTIK 8175 available from National Starch Corporation) is applied to one or both lamina and compressed with sufficient force, in this case 300 psi to compact the silver particles 41 against each other while extruding the binder 42 from between the stacked PTHs. In this case, at a temperature of 185° C., the silver particles diffuse into each other to form a substantially solid mass as well as interdiffusing into the copper to form a diffusion bond, as illustrated at 43.

EXAMPLE 3

Figure 5:
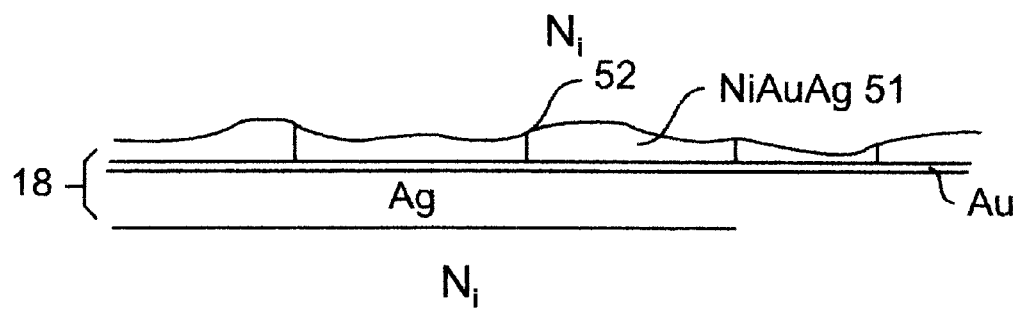

A result similar to that of Example 2 would be obtained with the addition of a further joining material layer of copper pads overplated with layers a of nickel and gold, as shown in FIG. 5. The use of nickel-gold is well known in the art as a surface finish. FIG. 5 is a multi-metal example which also confirms the development of a diffusion bond as is developed in the examples of FIG. 3 and FIG. 4, in particular. In this case, The joining material 18 is formed of layers of silver and gold over a nickel surface (e.g. electrolessly plated). Alternatively gold could be applied to one nickel surface and silver or gold and silver to the other. Diffusion bonding is performed at 300 psi and a maximum temperature of 185° C. This temperature is very much lower than known diffusion processes using these or similar materials and forms reliable joints without melting which was heretofore unknown and using relatively high melting point materials which can withstand temperatures necessary for assembly (e.g. resin curing) of the laminate.

A substantial thickness of interduffusion of Ni, Au and Ag diffusion bonding 51,can be readily observed. While slight voids 52 are observed extending through this diffused region, the area thereof is extremely small and of no practical effect on either the electrical or mechanical properties of the bond.

In view of the foregoing, it is seen that the invention provides a method of bonding conductive materials at low temperatures below the melting point of any metal used (and below the sintering temperature of ceramics) and below the temperature at which decomposition or damage to any substrate or dielectric usable in semiconductor packaging will occur. Therefore, the invention provides multi-layer conductor structures with full integrity of geometry, mechanical robustness and dielectric properties for use at any level of semiconductor device packaging.

While the invention has been described in terms of three preferred embodiments, those skilled in the art will recognize that the invention can be practiced with modification within the spirit and scope of the appended claims.

Having thus described our invention, what we claim as new and desire to secure by Letters Patent is as follows:

1. A process for joining substrates, comprising the steps of:
   providing a first substrate having first circuitized features of electrically conductive material on an external surface thereof;
   providing a second substrate of an electrically conductive material on an external surface thereof wherein at least some areas of said conductive material are located in a mirror image pattern to said first circuitized features;
   depositing a joining material on at least a portion of at least one of said first and second circuitized features;
   thereafter positioning said second substrate adjacent said first substrate with at least some of said second circuitized features or said joining material thereon in direct mechanical contact with said first circuitized features or said joining material thereon; and
   applying pressure and heat to said first and second substrates to laminate together said substrates and provide a diffusion bond between said at least some of said second circuitized features and said first circuitized features, said heat producing a temperature below a melting point of said joining material or said circuitized features.

2. A process as recited in claim 1, wherein said positioning step includes a step of
   providing insulating material between said first substrate and said second substrate.

3. A process as recited in claim 2, wherein said heat produces a temperature sufficient to achieve curing of said insulating material.

4. A process as recited in claim 1 wherein said areas of said second substrate are patterned conductive features on an insulator.

5. A process as recited in claim 1, wherein said joining material contains metal and said diffusion bond is a metal diffusion bond.

6. A method of forming a multi-layer connection structure having vertical connections between conductive areas on surfaces of respective lamina, said method comprising steps of
   applying joining material to portions of said conductive areas of at least one lamina,
   positioning at least two lamina with at least some of said conductive areas in registration with some of said conductive areas on another lamina, and
   diffusing at least one of said joining material and material of said conductive areas into the other at a temperature below the melting point of either said joining material or said material of said patterned conductive features.

7. A method as recited in claim 6, wherein said conductive areas on at least one said lamina are patterned conductive features.

8. A method as recited in claim 6, wherein said step of applying joining materials forms a layer having a thickness for defining a region in which said diffusing step is performed.

9. A method as recited in claim 6, wherein said diffusing step is performed at a temperature in a range from about 185° C. to about 400° C.

10. A method as recited in claim 6, wherein said diffusing step is performed at a pressure of about 200 psi to 300 psi.

11. A method as recited in claim 6, including the further step of interposing an insulating material between said two lamina.

12. A method as recited in claim 11, including the further step of bonding said insulating material to said at least two lamina.

13. A method as recited in claim 12, wherein said diffusing step and said bonding step are performed concurrently during a time period sufficient to complete said bonding step.

14. A method as recited in claim 13, wherein said diffusing step is performed at a temperature sufficient to complete said bonding step.

15. A method as recited in claim 7, wherein said joining material includes a metal.

16. A method as recited in claim 7, wherein said joining material contains metal and said diffusion bond is a metal diffusion bond.

17. A multi-layer connection structure having vertical connections between respective lamina, said vertical connections comprising patterned conductive features on facing surfaces of respective lamina, and a region at an interface of said patterned conductive feature in which material of said patterned conductive features and a joining material are interdiffused without solution of either in the other to form a diffusion bond.

* * * * *